United States Patent [19]
Hasegawa

[11] Patent Number: 5,821,780
[45] Date of Patent: Oct. 13, 1998

[54] COMPARATOR OPERABLE WITH LOW POWER SUPPLY VOLTAGE

[75] Inventor: Hiroshi Hasegawa, Tokyo, Japan

[73] Assignee: NEC Corporation, Tokyo, Japan

[21] Appl. No.: 672,078

[22] Filed: Jun. 26, 1996

[30] Foreign Application Priority Data

Jun. 30, 1995 [JP] Japan ................................ 7-188301

[51] Int. Cl.$^6$ ................................ H03K 5/22
[52] U.S. Cl. ................................ 327/63; 327/91; 327/309
[58] Field of Search ................................ 327/51, 52, 54, 327/55–57, 63–65, 69, 71, 74–77, 90, 91, 93–97, 215, 219, 309, 312, 321, 337, 362, 378, 382, 554

[56] References Cited

U.S. PATENT DOCUMENTS

| | | | |
|---|---|---|---|
| 5,173,870 | 12/1992 | Sukashita et al. | 327/215 |
| 5,264,740 | 11/1993 | Wright | 327/63 |
| 5,546,028 | 8/1996 | Yamaguchi | 327/90 |
| 5,565,800 | 10/1996 | Kobayashi | 327/65 |
| 5,635,864 | 6/1997 | Jones | 327/77 |

OTHER PUBLICATIONS

T. Matsuura et al., "A 95–mW, 10–bit, 15–MHz Low–Power CMOS ADC Using Double–Sampled Pipelining", ICD92–21, pp. 17–22.

*Primary Examiner*—My-Trang Nu Ton
*Attorney, Agent, or Firm*—Ostrolenk, Faber, Gerb & Soffen, LLP

[57] ABSTRACT

A comparator includes a sampling section for respectively obtaining first and second voltage signals from first and second target voltage signals. An amplifier section includes first and second amplifiers and amplifies the obtained first and second voltage signals by the first and second amplifiers, respectively. A shifting section shifts the obtained first and second voltage signals into predetermined operation ranges of the first and second amplifiers in voltage level, respectively. A latching section latches outputs of the first and second amplifiers to output data determined based on the first and second voltage signals.

30 Claims, 6 Drawing Sheets

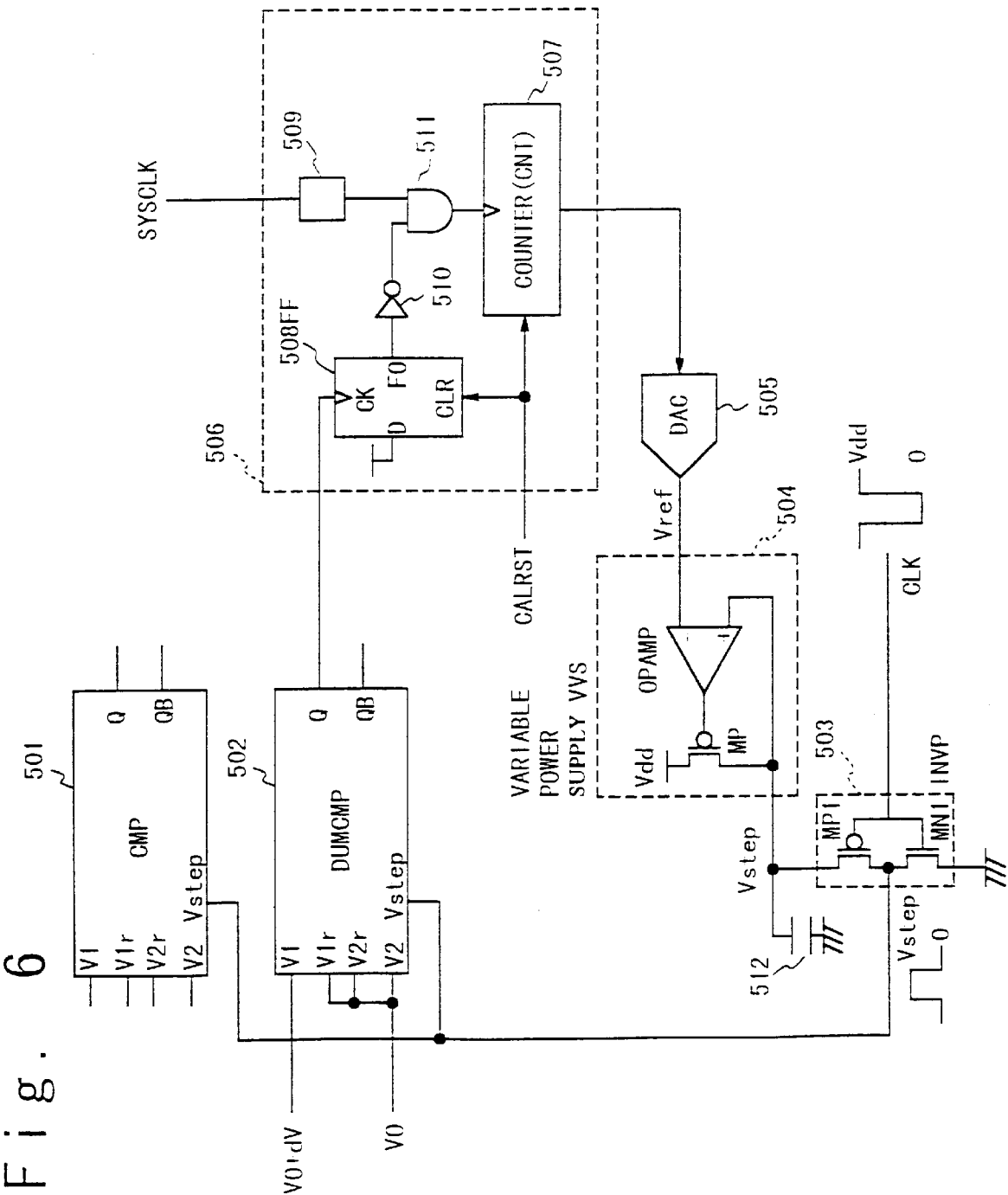

COMPARATOR OPERABLE WITH LOW POWER SUPPLY VOLTAGE

BACKGROUND OF THE INVENTION

1. Field of the Invention

The present invention relates to a comparator, and more particularly, to a comparator which is suitable to operate with a low power supply voltage.

2. Description of Related Art

In recent years, a differential operation type comparator is required which can operate with a low power supply voltage at a high speed and has low power consumption. The differential operation type comparator has an advantage in endurance against in-phase noise. Such a type of comparator is used in an integrated circuit to which the comparator is applied, such as a memory and an analog-to-digital (A/D) converter, as shown in "A 95-mW, 10-bit, 15-MHz Low-power CMOS ADC using Double-sampled Pipelining" by T. Matsuura.

A conventional comparator will be described below with reference to FIG. 1. FIG. 1 is a block diagram which shows the structure of the comparator using a conventional differential amplifier. The comparator is conventionally well known as the differential operation-type comparator. The comparator compares two voltage differences, i.e., a first voltage difference (=V1−V1r) between a first input voltage V1 and a first reference voltage V1r, and a second voltage difference (=V2−V2r) between a second input voltage V2 and a second reference voltage V2r. Then, the comparator outputs a digital value of "1" or "0" in accordance with the comparing result. The comparator performs a comparing operation in this manner.

That is, referring to FIG. 1, the first input voltage V1 and the first reference voltage V1r are connected in common to a node N101 through a first switch SW101 and a second switch SW102, respectively. The second input voltage V2 and the second reference voltage V2r are also connected in common to a node N102 through a third switch SW103 and a fourth switch SW104, respectively. The nodes N101 and N102 are connected to nodes N103 and N104 through a first capacitor C101 and a second capacitor C102, respectively. The nodes N103 and N104 are connected to a differential input terminals of a differential amplifier (AMP) 601. Differential output terminals N105 and N106 of the differential amplifier (AMP) 601 are connected to nodes N107 and N108 through a third capacitor C103 and a fourth capacitor C104, respectively. Also, the differential output terminals of the differential amplifier (AMP) 601 are connected to the nodes N103 and N104 through a fifth switch SW105 and a sixth switch SW106 to feed back the differential output of the differential amplifier 601 to the nodes N103 and N104, respectively. Nodes N107 and N108 are connected to input terminals of a differential latch circuit (DLAT) 602. Also, the nodes N107 and N108 are connected to fixed bias potentials through a seventh switch SW107 and an eighth switch SW108, respectively.

In the circuit structure, if the first reference voltage V1r and the second reference voltage V2r are set to an identical potential, the first input voltage V1 and the second input voltage V2 can be compared to each other even if the inner circuit is the differential operation structure. Therefore, for purpose of simplified explanation, the first reference voltage V1r and the second reference voltage V2r are supposed to be both set to a reference voltage Vcom.

Next, the operation of the conventional comparator will be described below with reference to FIG. 1.

First, in a comparison preparation period (an automatic-zero period), the switches SW101, SW103, SW105, SW106, SW107 and SW108 are set to the on state (to be also referred to as "a conductive state" or "a closed state"). On the other hand, the switches SW102 and SW104 are set to an off state (to be also referred to as "a non-conductive state" or "an open state"). In the differential amplifier 601, an feed-back operation is performed from the nodes N105 and N106 to the nodes N103 and N104 through the switches SW105 and SW106, so that the input voltages of the nodes N103 and N104 are biased such that the voltages of the nodes N103 and N104 become equal to the outputting voltages of the nodes N105 and N106, respectively. The first capacitor C101 and the second capacitor C102 are charged with the first input voltage V1 and the second input voltage V2, respectively. In this case, if the offset voltages are present in the differential amplifier (AMP) 601, the first to fourth capacitors C101 to C104 are charged.

Next, in the comparison period, the switches SW101, SW103, SW105, SW106, SW107 and SW108 are turned off and the switches SW102 and SW104 are turned on. At this time, the input voltages to the differential amplifier (AMP) 601, i.e., the voltages of the nodes N103 and N104, are changed from their biased voltage points by a voltage difference ΔV1 (−V1=Vcom) and a voltage difference ΔV2 (=V2−Vcom) for the capacitive coupling by the capacitors C101 and C102, respectively. The differential amplifier (AMP) 601 sufficiently amplifies the voltage difference of (ΔV1−ΔV2) for the next stage differential latch (DLAT) 602 to be able to operate. The sufficiently amplified output is supplied to the differential latch (DLAT) 602 through the capacitive coupling by the third capacitor C103 and the fourth capacitor C104 so that the differential latch 602 outputs the complementary digital values Q and QB.

It should be noted that the similar comparison operation can be performed even if the switches SW101 and SW103 are turned off in the comparison preparation period and turned on in the comparison period and the switches SW102 and SW104 are turned on in the comparison preparation period and turned off the comparison period. Also, because the capacitive coupling by the capacitor transfers only the voltage difference, the offset voltages in the differential amplifier which has been charged in the automatic-zero period are canceled.

There are the following problems in the conventional comparator shown in FIG. 1. That is, first, the differential amplifier is used in the above-mentioned conventional comparator. For this reason, when the power supply voltage is decreased, the characteristics of amplification and operation speed of the differential amplifier are degraded greatly. This is because the differential amplifier is constituted to connect a lot of transistors between a power supply line and a ground line in series, so that the voltage sufficient to turn on the transistor is not applied to each of the lot of transistors, when the power supply voltage is low. For this reason, the conventional comparator using the differential amplifier cannot accomplish sufficient resolution in the low power supply voltage.

Also, the differential amplifier always consumes current from a current source because the common connection node between transistors of a differential operation is connected to the constant current source. For this reason, there is a problem in that the power consumption is great in the differential amplifier.

Further, as shown in FIG. 1, in the conventional comparator, the feed-back operation is performed during the automatic-zero period using the switches to determine the operation bias points of the comparator. In a case of such a method of setting the operation bias points, however, a long time period is required for the automatic-zero period because the conduction resistance ("on resistance") of the switch is very large in the low power supply voltage. As a result, there is a problem in that the operation speed of the comparator is decreased greatly.

SUMMARY OF THE INVENTION

The present invention is performed in the light of above-mentioned circumstances and has, as an object, to provide a comparator operable at a high speed with less power consumption in a low power supply voltage and a method for the same.

Another object of the present invention is to provide a comparator in which an operation point shifting section and an amplifier section with feed back function are separately provided, and a method for the same.

In order to achieve an aspect of the present invention, a comparator includes a sampling section for respectively obtaining first and second voltage signals from first and second target voltage signals, an amplifier section including first and second amplifiers, for respectively amplifying the obtained first and second voltage signals by the first and second amplifiers, a shifting section for shifting the obtained first and second voltage signals into predetermined operation ranges of the first and second amplifiers in voltage level, respectively, and a latching section for latching outputs of the first and second amplifiers to output data determined based on the first and second voltage signals.

The first and second amplifier are desirably inversion amplifiers, specifically, dynamic operation type inverters. For instance, each of the first and second amplifier comprises a transistor, and a switch connected to the transistor in series.

The amplifier section may further include a first capacitive component for feeding back the output of the second amplifier to an input of the first amplifier, and a second capacitive component for feeding back the output of the first amplifier to an input of the second amplifier. In this case, the voltage difference can be further expanded.

The shifting section is composed of a first capacitor connected to an input of the first amplifier at one terminal, a second capacitor connected to an input of the second amplifier at one terminal, a voltage applying section connected to the other terminals of the first and second capacitors, for applying a shift voltage to the other terminals of the first and second capacitors to change voltages at the one terminals of the first and second capacitors. In this case, it is preferable that the shifting section further includes a section for selectively setting the voltages at the one terminals of the first and second capacitors to predetermined voltages, respectively. The voltage applying section applies to the other terminals of the first and second capacitors voltage pulses such as voltage pulses whose magnitude gradually increases in a step manner. For instance, the voltage applying section is composed of a counter section for counting a clock signal, a variable power supply section for supplying variable voltage determined based on the count of the counter section, and a step-like voltage pulse applying section for applying to the other terminals of the first and second capacitors the voltage pulses having the variable voltage in magnitude as the shift voltage such that voltages at the one terminals of the first and second capacitors are changed.

The sampling section includes first and second capacitors, a first switch section disposed to respectively apply the first and second target voltage signals to one terminals of the first and second capacitors, and a second switch section disposed to respectively apply first and second reference voltage signals to the one terminals of the first and second capacitors. The first and second capacitors are desirable to be set to first and second predetermined voltages. Also, the comparator desirably includes a section for selectively disconnecting the sampling section from the amplifier section.

In order to achieve another aspect of the present invention, a method of outputting binary data corresponding to two voltage signals, includes the steps of:

sampling first and second target voltage signals to produce first and second voltage signals in first and second periods, respectively;

shifting the sampled first and second voltage signals into a predetermined operation range of amplifier section in voltage level in a third period, respectively;

amplifying the shifted first and second voltage signals by the amplifiers section in the third period; and latching outputs of the amplifier section to output a binary data determined based on the first and second voltage signals in the third period.

In this case, the first and second target voltage signals are applied to one terminals of first and second capacitors in one of the first and second periods, respectively and first and second reference voltage signals are applied to the one terminals of the first and second capacitors in the other of the first and second periods, respectively. As a result, a voltage difference between the first target voltage signal and the first reference voltage signal is obtained as the first voltage signal and a voltage difference between the second target voltage signal and the second reference voltage signal is obtained as the second voltage signal.

Also, the other terminals of the first and second capacitors may be set to first and second predetermined voltages in the first period or disconnected from the amplifier section in the third period.

In a preferred embodiment, the comparator includes first to fourth capacitors, a bias section disposed between one terminal of the first capacitor and one terminal of the third capacitor and between one terminal of the second capacitor and one terminal of the fourth capacitor, for selectively setting the first to fourth capacitors to a predetermined voltage, a voltage applying section connected to the other terminals of the third and fourth capacitors, for applying a shift voltage to the other terminals of the third and fourth capacitors to change voltages at the one terminals of the third and fourth capacitors, an amplifier section for amplifying the changed voltages at the one terminals of the third and fourth capacitors, and a data latch section for outputting a data corresponding to voltage signals supplied to the other terminals of the first and second capacitors.

The amplifier section includes first and second inversion amplifiers for amplifying the changed voltages at the one terminals of the third and fourth capacitors, respectively and may further include a fifth capacitor for feeding back the output of the first inversion amplifier to an input of the second inversion amplifier and a sixth capacitor for feeding back the output of the second inversion amplifier to an input of the first inversion amplifier.

The bias section may include first switches connected between the one terminal of the first and second capacitors and the ground potential, respectively, second switches connected between the one terminal of the first capacitor and the one terminal of the third capacitor and between the one terminal of the second capacitor and the one terminal of the fourth capacitor, and third switches connected between the one terminal of the third and fourth capacitors and the ground potential, respectively. Or, the bias section may include first switches connected between the one terminal of the first and second capacitors and the ground potential, respectively, and second switches connected between the one terminal of the first capacitor and the one terminal of the third capacitor and between the one terminal of the second capacitor and the one terminal of the fourth capacitor. Alternatively, the bias section may include first switches connected between the one terminal of the first capacitor and the one terminal of the third capacitor and between the one terminal of the second capacitor and the one terminal of the fourth capacitor, and second switches connected between the one terminal of the third and fourth capacitors and the ground potential, respectively.

In this embodiment, it is preferable that all the switches are composed of metal insulator semiconductor field effect transistor (MISFET) and each of amplifiers is composed of a switch and a bipolar transistor.

BRIEF DESCRIPTION OF THE DRAWINGS

FIG. 6 is a block diagram illustrating the structure of a pulse voltage supply circuit used in the first to third embodiments of the present invention.

DESCRIPTION OF THE PREFERRED EMBODIMENTS

A comparator of the present invention will be described in detail with reference to the accompanying drawings.

Figure 1:
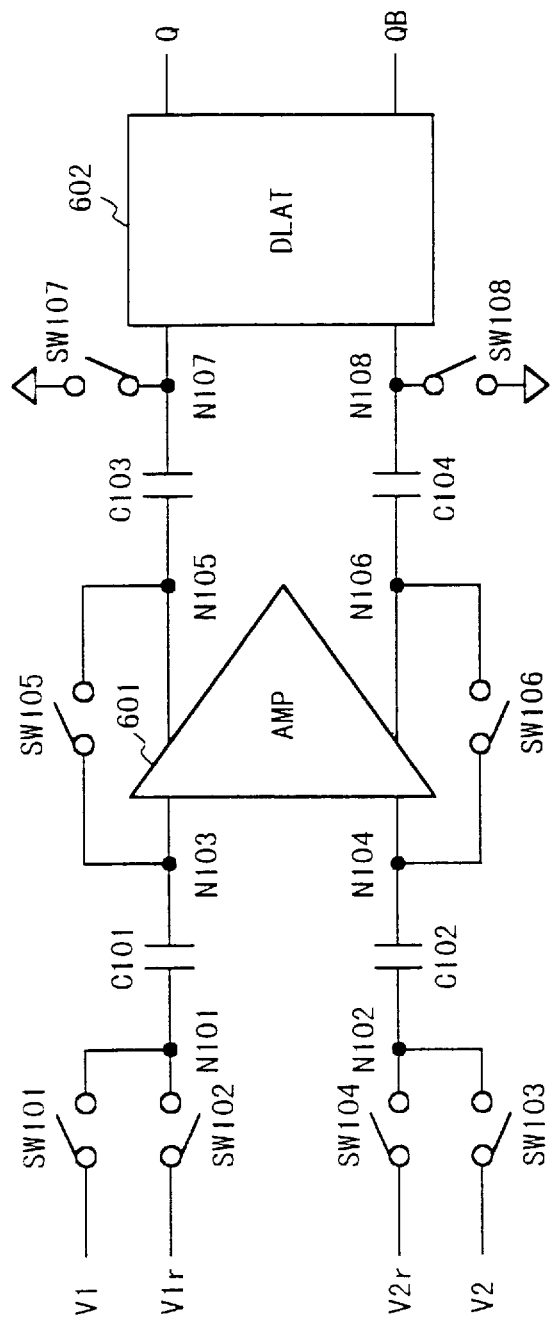
FIG. 1 is a circuit diagram illustrating the structure of a conventional comparator.
Figure 2:
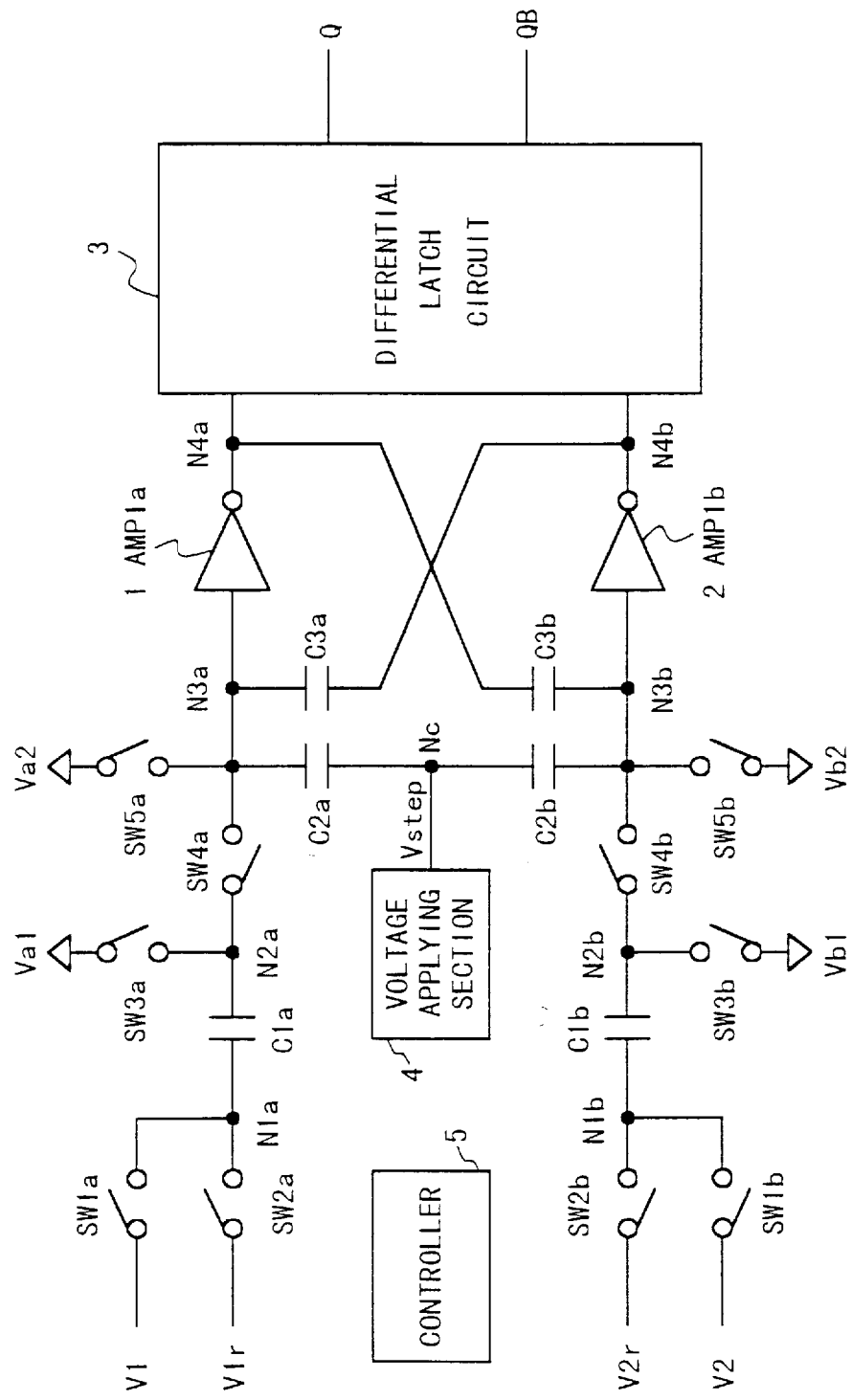
FIG. 2 is a circuit diagram illustrating the structure of a comparator according first embodiment of the present invention.

First, the comparator according to the first embodiment of the present invention will be described. FIG. 2 is a circuit diagram illustrating the comparator according to the first embodiment of the present invention. The comparator of the present invention has the differential-type structure. For the description, an identical element name, e.g., "SW1", is generally used for corresponding ones of elements on first and second voltage (V1 and V2) signal paths. Also, a reference of each of elements on a first input voltage (V1) signal path is added with "a" to the end of reference and the reference of each of elements on a second input voltage (V2) signal path is added with "b" to the end of reference. It is such as "SW1a" and "SW1b".

In the comparator of the present embodiment, a voltage difference ΔVa(=V1−V1r) between the first input voltage V1 and a first reference voltage V1r and a voltage difference ΔVb (=V2−V2r) between the second input voltage V2 and a second reference voltage V2r are compared to each other in magnitude and the digital values Q and QB are outputted based on the comparison result.

First, the structure of comparator according to the first embodiment will be described below with reference to FIG. 2. Referring to FIG. 2, on the first input voltage V1 signal path, the first input voltage V1 and the first reference voltage V1r are connected to a first node N1a through a first switch SW1a and a second switch SW2a, respectively. The first node N1a is connected to a second node N2a through a first capacitor C1a. The second node N2a is connected to a bias power supply Va1 of a third switch SW3a. Also, the second node N2a is connected to a third node N3a through a fourth switch SW4a. The third node N3a is connected to a second bias power supply Va2 through a fifth switch SW5a. Also, the third node N3a is connected to one of the two terminals of a second capacitor C2a. The other terminal of the second capacitor C2a is connected to a pulse power supply (Vstep) via a common node Nc. The third node N3a is further connected to an input terminal of an inversion amplifier (AMP1a) 1 of amplifier means. The output of the amplifier (AMP1a) 1, i.e., the voltage of a fourth node N4a, is connected to one of the two input terminals of a differential latch (DLAT) 3.

For the differential operation, the elements on the second voltage V2 signal path are connected in a similar manner to those on the above first input voltage V1 signal path. That is, the second input voltage V2 and a second reference voltage V2r are connected to a first node N1b through a first switch SW1b and a second switch SW2b, respectively. The first node N1b is connected to a second node N2b through a first capacitor C1b. The second node N2b is connected to a bias power supply Vb1 of a third switch SW3b. Also, the second node N2b is connected to a third node N3a through a fourth switch SW4a. The third node N3a is connected to a second bias power supply Vb2 through a fifth switch SW5a. Also, the third node N3a is connected to one of the two terminals of a second capacitor C2b. The other terminal of the second capacitor C2b is connected to the pulse power supply (Vstep) via the common node Nc. The third node N3b is further connected to an input terminal of an inversion amplifier (AMP1b) 2 of the amplifier means. The output of the amplifier (AMP1b) 2, i.e., the voltage of a fourth node N4b, is connected to the other input terminal of the differential latch (DLAT) 3.

A third capacitor C3a is connected between the third node N3a and the fourth node N4b and a third capacitor C3b is connected between the third node N3b and the fourth node N4a. As a result, the output of the inversion amplifier (AMP1a) 1 is supplied or fed back to the input of the inversion amplifier (AMP1b) 2. Similarly, the output of the inversion amplifier (AMP1b) 2 is supplied or fed back to the input of the inversion amplifier (AMP1a) 1.

Thus, if the first reference voltages V1r and the second reference voltage V2r are connected to a common reference voltage Vcom, the first input voltage V1 can be directly compared with the second input voltage V2. The digital outputs Q and QB from the differential latch 3 is complementary outputs and the digital values opposite to each other are outputted when the determination result by the differential latch 3 is effective.

Next, the operation of the comparator according to the first embodiment of the present invention will be described below.

In a period T1, the first switch SW1a and SW1b, and the third switch SW3a and SW3b are turned on and the second nodes N2a and N2b are reset or initialized to the first bias voltages Va1 and Vb1, respectively. Also, the first capacitors C1a and C1b are charged by the input voltage V1 and the second voltage V2, respectively. That is, the first voltage V1 and the second voltage V2 are sampled in the capacitors C1a and C1b, respectively.

In the period T2, 2 the second switch SW2a and SW2b are turned on. On the other hand, the first switch SW1a and SW1b, and the third switch SW3a and SW3b are turned off. As a result, the first reference voltage V1r and the second reference voltage V2r are applied to the first capacitors C1a and C1b, respectively. Therefore, the voltage difference $\Delta Va$ (=V1−V1r) and the voltage difference $\Delta Vb$ (=V2−V2r) appear on the second nodes N2a and N2b.

By turning on the fifth switches SW5a and SW5b during the period T1 and/or the period T2, the third nodes N3a and N3b are reset to the first bias voltage Va2 and the second bias voltage Vb2, respectively.

When the fourth switches SW4a and SW4b are turned on during the periods T1 and T2, the respective voltage difference changes, i.e., $\Delta Va1$ and $\Delta Vb1$, on the third nodes N3a and N3b (or the second nodes N2a and N2b) are approximately given by the following equations (1) and (2).

$$\Delta Va1 = \{C1a/(C1a+C2a+C3a+Cp1a)\} \times \Delta Va \quad (1)$$

$$\Delta Vb1 = \{C1b/(C1b+C2b+C3b+Cp1b)\} \times \Delta Vb \quad (2)$$

where capacities Cp1a and Cp1b represent parasitic capacities which parasitize the third nodes N3a and N3b(or the second nodes N2a and N2b), respectively.

In the period T3, after the fourth switches SW4a and SW4b are turned off, the pulse voltage (or pulse voltage gradually increasing in magnitude in a step manner) Vstep is applied from a voltage applying section 4 to the node Nc to which the second capacitors C2a and C2b are connected. When the step-like pulse voltage is applied to the one end of each of the second capacitors C2a and C2b, the voltages of the third nodes N3a and N3b is shifted in voltage level by only the step voltage $\Delta Vstep$, because the fourth switches SW4a and SW4b and the fifth switches SW5a and SW5b are turned off. In this manner, the voltages of the third node N3a and N3b is quickly shifted in level to an operation point Vamp of an optimal operation range of each of the inversion amplifiers AMP1a and AMP1b, while maintaining the relation that one of the voltage changes $\Delta Va1$ and $\Delta Vb1$ is greater than the other. The voltages V(N3a) and V(N3a) of the third nodes N3a and N3b at this time is approximately given by the following equations (3) and (4).

$$V(N3a) = \pm\{C2a/(C2a+C3a+Cp2a)\} \times \Delta Vstep + \Delta Va1 + \Delta Vc \quad (3)$$

$$V(N3b) = \pm\{C2b/(C2b+C3b+Cp2b)\} \times \Delta Vstep + \Delta Vb1 + \Delta Vc \quad (4)$$

where in the equations (3) and (4), Cp2a and Cp2b represent parasitic capacities which parasitize the third nodes N3a and N3b, respectively. Therefore, the parameters can be set from the above equations (3) and (4) in such a manner that the voltages V(N3a) and V(N3a) of the third nodes N3a and N3b are set near optimal operation points Vamp of the amplifier AMP1a and AMP1b. For instance, a digital control clock signal used in a device which includes the comparator may be used, instead of the pulse voltage Vstep from a special voltage signal source.

In the above embodiment, since the pulse voltage Vstep is applied to the capacitors C2a and C2b after the fourth switches SW4a and SW4b are turned off or opened, the influence of the first capacitors C1a and C1b is excluded from the denominator of the first term on the right side of each of the above equations (3) and (4). Accordingly, the transfer efficiency of the voltage difference $\Delta Vstep$ is improved. Also, because the fourth switches SW4a and SW4b are turned off in the period T3, the second nodes N2a and N2b are started to be reset for the next period T1 using the third switches SW3a and SW3b at that time. This is convenient in case of the high-speed operation.

In the period T3, the difference between the input voltage of the amplifier AMP1a and the input voltage from the amplifier AMP1b is amplified during and after the level shift in correspondence to the relation that one of the voltage changes $\Delta Va1$ and $\Delta Vb1$ is greater than the other. Here, because the first and second inversion amplifiers AMP1a and AMP1b are used as the amplification means and the outputs of the inversion amplifiers AMP1a and AMP1b are fed back to the inputs of the inversion amplifiers AMP1b and AMP1a using the capacitors C3b and C3a, the output voltage difference between the output of the amplifier AMP1a and the output of the amplifier AMP1b is further increased. In this case, the third coupling capacitors C3a and C3b may be substituted by parasitic capacities. Also, even if capacitor components corresponding to the third coupling capacitors C3a and C3b are not specifically provided, the comparator can operate. If non-inversion amplifiers are used in the amplifier means, the output of one of the non-inversion amplifiers may be negatively fed back to the input of the other non-inversion amplifier.

The voltage difference between the nodes N3a and N3b is sufficiently amplified by the inversion amplifiers AMP1a and AMP1b in such a manner that the input offset of the differential latch (DLAT) 3 can be ignored. The differential latch (DLAT) 3 is driven in accordance with the amplified voltage difference to output the digital complementary outputs Q and QB.

In the above embodiment, if the fourth switches SW4a and SW4b are turned on after the periods T1 and T2, the voltage differences $\Delta Va$ and $\Delta Vb$ cause voltage changes $\Delta Va1$ and $\Delta Vb1$ at the third nodes N3a and N3b, respectively. Even in this case, the relation that one of the voltage differences $\Delta Va$ and $\Delta Vb$ is greater than the other is maintained regardless of the voltage differences $\Delta Va1$ and $\Delta Vb1$. The voltage difference changes may be compared in the above-mentioned in the period T3. Unless all the first bias voltages Va1 and Vb1 and second bias voltages Va2 and Vb2 need to be provided individually, these bias voltages Va1, Vb1, Va2 and Vb2 can be set to the same voltage Vc. It is more practical to use the single power supply. In this case, if the fourth switches SW4a and SW4b are turned on in the period T1, the second nodes N2a and N2b and the third nodes N3a and N3b can be reset to the common voltage Vc. Also, in this case, either the set of third switches Sw3a and SW3b or the set of fifth switches SW5a and SW5b may be omitted or removed.

In the comparator of the present embodiment, there is a constraint in which when both of the voltage difference $\Delta Va$ (=V1−V1r) and the voltage difference $\Delta Vb$ (=V2−V2r) are too large, and it is difficult to level-shift the voltage differences to the optimal operation points Vamp of the inversion amplifiers AMP1a and AMP1b. However, in a lot of applications which use the comparator, generally, either of the input voltage V1 and the input voltage V2 is a known reference voltage. Accordingly, if either of the reference voltages V1r or V2r is appropriately set, the above-mentioned constraint does not act as a problem in practical use.

Figure 3:
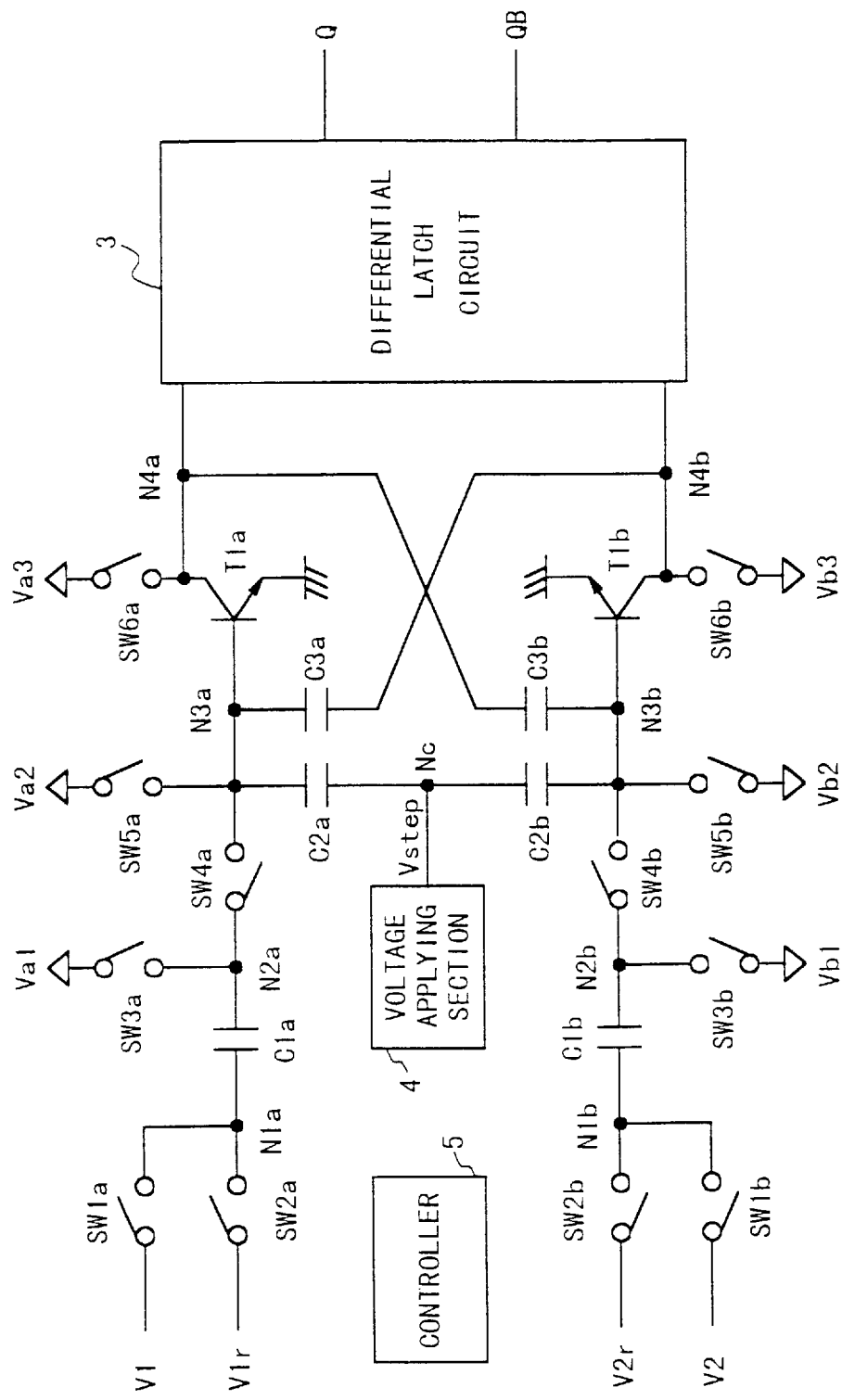
FIG. 3 is a circuit diagram illustrating the structure of a comparator according to a second embodiment of the present invention.

Next, the comparator according to the second embodiment of the present invention will be described. FIG. 3 is a circuit diagram illustrating the structure of the comparator according to the second embodiment of the present invention. Referring to FIG. 3, the amplification means AMP1a of the first embodiment shown in FIG. 2 is constituted of a combination of a transistor T1a and a sixth switch SW6a in this embodiment. Also, the amplification means AMP1b is constituted of a combination of a transistor T1b and a sixth switch SW6b. Thus, the amplification means is composed of a dynamic operation type inverter. Because the comparator of the present invention is designed to level-shift the voltage difference to the optimal operation point of the amplification means AMP1a or AMP1b using the coupling capacitor C2a or C2b and the pulse voltage Vstep, the dynamic operation type inverter can be used which is difficult to perform the automatic zero operation. Capacity components required for the dynamic operation are not shown in FIG. 3. This is because parasitic capacities are generally used as these capacity components. Third bias voltages Va3 and Vb3 are connected via the six switches SW6a and SW6b to the collector terminals of the transistors T1a and T1b which compose the inverters, respectively and provide precharge voltages for the dynamic operation. Because the inverter of the dynamic operation type is used, the amplification means has a small input capacitance and high-speed operation capability. Also, because the transistor of the inverter is used only for discharging the electric charge of the output terminal. Therefore, this type of inverter has low power consumed because power is not consumption except for charge current and discharge current. In addition, in this type of inverter, a single transistor is only required between the power supply and the ground except for the switch, resulting in accomplish of low power supply voltage operation. It should be noted that although the bipolar transistor is used as the transistor T1a or T1b in the second embodiment, the field effect transistor (FET) such as metal-insulator-semiconductor (MIS) type FET may be used.

Figure 4:
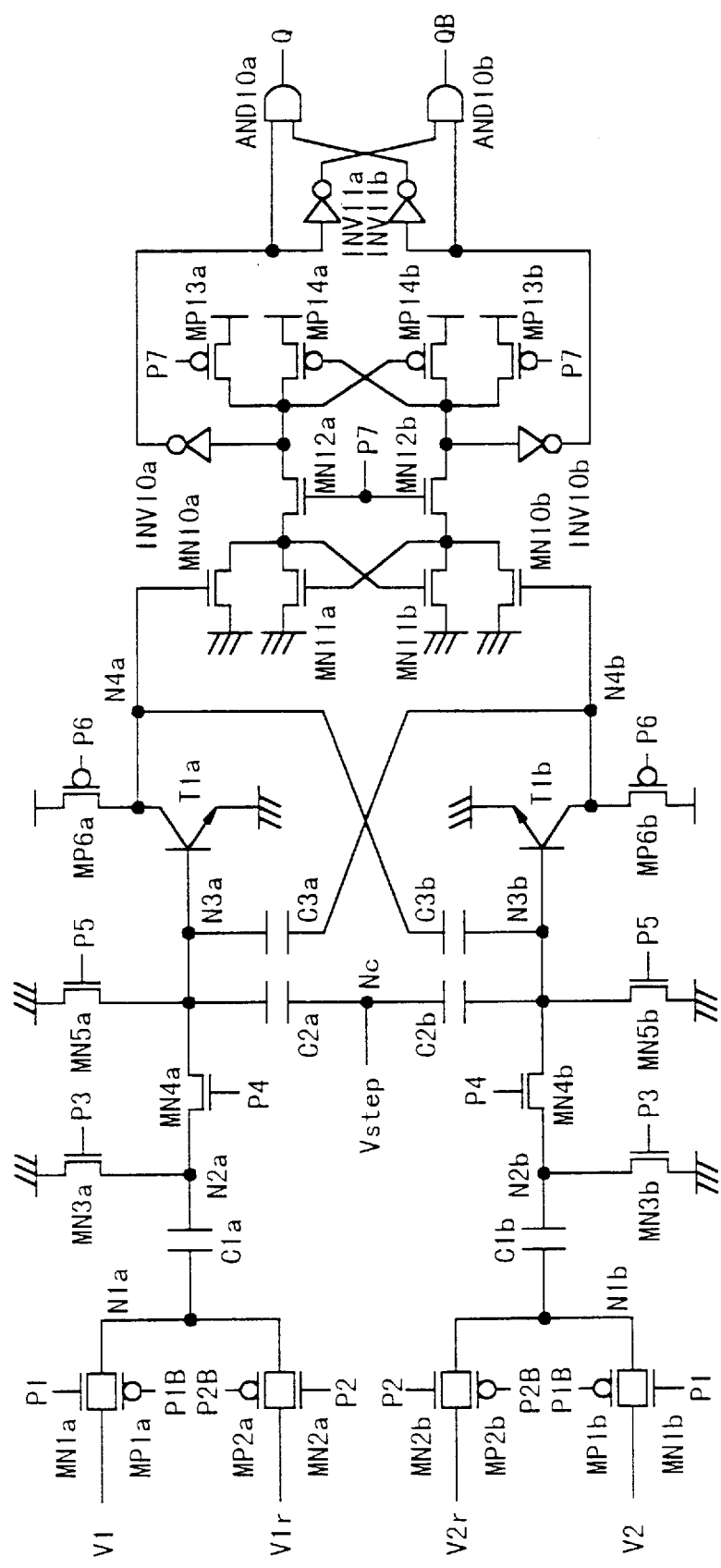
FIG. 4 is a circuit diagram illustrating the structure of a comparator according to the third embodiment of the present invention.

Next, the comparator according to the third embodiment of the present invention will be described below with reference to FIG. 4. FIG. 4 shows the structure of the comparator according to the third embodiment of the present invention in further detail. Referring to FIG. 4, in the comparator of the third embodiment, the switches and differential latch (DLAT) of FIG. 3 are composed MOSFETs and the transistors T1a and T1b of the amplification means of FIG. 3 are composed of bipolar transistors. Such a structure can be produced using BiCMOS process technology. In the comparator of the present embodiment, the features of bipolar transistor and MOSFET are successfully utilized. That is, the MOSFET has the ideal switch characteristic, whereas, the bipolar transistor is a high transconductance (high gm) and a high element precision. Also, although it is considered that the bipolar transistor consumes the power more than the MOSFET, there is not increase of the power consumption, because the bipolar transistors T1a and T1b are used only for the discharge operation of the precharged electric charge in the present embodiment. Further, the bipolar transistor is not influenced by base current before the level shift using the pulse voltage Vstep as shift voltage because the base voltage of the bipolar transistor is less than forward direction bias $V_F$ of the bipolar transistor.

In the present embodiment, in order to allow a wide input voltage range, the complementary-type analog switch (which is also called "a pass transistor") in which is composed of an N-channel MOSFET MN1a and a P-channel MOSFET MP1a is used as the first switch SW1a of FIG. 3. Similarly, the first switch SW1b and the second switches SW2a and SW2b are composed of a set of MN1b and MP1b, a set of MN2a and MP2a, and a set of MN2b and MP2b, respectively. Further, the ground voltage (GND) is used as the reset bias voltage for the second nodes N2a and N2b and the third nodes N3a and N3b. As a result, the third switches SW3a and SW3b, the fourth switches SW4a and SW4b, and the fifth switches SW5a and SW5b shown in FIG. 3 can be all composed of an N-channel MOSFET, resulting in parasitic capacity reduced. Also, because the function of the third switches SW3a and SW3b can be accomplished by the fifth switches SW5a and SW5b, the parasitic capacity can be further reduced in a case that the third switches SW3a and SW3b are removed.

FIG. 4 also shows the structure detail of an example of differential latch DLAT of FIG. 3. Referring to FIG. 4, the differential latch (DLAT) is composed of MOSFETs MN10a, MN10b, MN11a, MN11b, MN12a, MN12b, MP13a, MP13b, MP14a and MP14b, inverters INV10a, INV10b, INV11a, and INV11b, and logic product (AND) gates AND10a and AND10b. The MOSFETs MN10a and MN10b are input transistors of the differential latch. When input (gate voltage) is greater than the threshold voltages of the MOSFET MN10a and MN10b, the latch outputs Q and QB are "1" and "0", respectively, if (the input voltage of MN10a)>d (the input voltage of MN10b). Also, if (the input voltage of MN10a)<( the input voltage of MN10b), the latch outputs Q and QB are "0" and "1", respectively. The differential latch (DLAT) is set to the reset state when the MOSFETs MN12a and MN12 and the MOSFETs MP13a and MP13b are all turned off or set in the non-conductive state and the differential latch (DLAT) is set to the latch state when the MOSFETs MN12a and MN12 and the MOSFETs MP13a and MP13b are all turned on or set in the conductive state. When the MOSFETS MN12a and MN12b and the MOSFETs MP13a and MN13b are all turned on, the MOSFETs MN11a and MN11b constitute a latch circuit composed of two inverters in which the inputs and outputs are connected in a crossing manner. The inverter INV10a buffers or reinforce the output of the latch circuit. The inverters INV11a and INV11b and the logic product circuits AND10a and AND10b set the outputs Q and QB to "0" when the differential output Q and QB are "1" together, i.e., after the reset operation is executed.

Next, the voltage applying section 4 will be described. As described above, the comparator of the present invention requires means for applying pulse voltage Vstep. The pulse voltage Vstep may be directly from the outside of comparator, or the outside of an application device using the comparator. The pulse voltage Vstep is used to accurately level-shift the voltages at the nodes N3a and N3b into the operation range near to the threshold voltage or operation point of the amplifiers and the accuracy of the voltage magnitude of the pulse voltage Vstep is required to utilize the efficiency of the comparator to the full. The pulse voltage Vstep can be determined from the above equations (3) and (4) but if the capacitances C2a, C2b, C3a, C3b, Cp2a and Cp2b change because of fluctuation in the manufacturing process, it is necessary to adjust the voltage Vstep. However, when a dummy comparator is provided to a comparator application device, it takes a long time to adjust the pulse voltage Vstep from the outside of the device while observing the output of the dummy comparator.

In order to solve the above problem, therefore, the pulse voltage applying section is required in which the pulse voltage Vstep can be automatically adjusted in the application device. FIG. 6 shows the structure of such a pulse voltage applying section. Referring to FIG. 6, the pulse voltage applying section is composed of more than one comparators (CMP) 501 which are used in the application device, a dummy comparator (DUMCMP) 502 which is the same as the comparator (CMP) 501, a drive circuit (INVP) 503 which supplies to the comparators 501 and dummy comparator 502 with the pulse voltage, a variable voltage power supply (VVS) 504 which supplies a drive reference voltage Vstep for the drive circuit (INVP) 503, a digital-toanalog (D/A) converter (DAC) 505 which outputs a control voltage Vref to the variable voltage power supply (VVS) 504, a count control circuit (CNTL) 506 which the count operation is controlled by the output Q of the dummy comparator (DUMCMP) 502 and supplies the count result to the D/A converter (DAC) 505, and a capacitor 512. As the D/A converter (DAC) 505, a resistance string D/A converter may be used. The count control circuit (CNTL) 506 is composed of the counter (CNT) 507, a flip-flop (FF) 508, a dividing circuit 509, and an inverter (PRS) 510, and an AND gate 511.

Next, the operation of the pulse voltage applying section 4 will be described. At this embodiment, as the comparator, it is supposed that the comparator according to the above third embodiment shown in FIG. 4 is used.

The counter (CNT) 507 and the flip-flop (FF) 508 are reset by a calibration reset signal CALRST. The initial value data of the counter (CNT) 507 is supplied to the D/A converter (DAC) 505 and, as a result of this, the input control voltage Vref is generated for the variable voltage power supply (VVS) 504. In this example, the variable voltage power supply (VVS) 504 is the reduced voltage power supply and generates the voltage which is lower than the power supply voltage Vdd. In the variable voltage power supply (VVS) 504, a differential amplifier OPAMP and a transistor MP operate to make the output voltage Vstep equal to the input control voltage Vref. Because the output voltage Vstep of the variable voltage power supply (VVS) 504 acts as the power supply voltage of the drive inverter (INVP) 503, when a clock signal CLK which has usual amplitude Vdd is inputted to the drive inverter (INVP) 503, the output amplitude of the drive inverter (INVP) 503 becomes Vstep. As a result, the output is supplied to the comparator (CMP) 501 and the dummy comparator (DUMCMP) 502. In this case, voltage dV of the necessary minimum resolution is given to the input of the dummy comparator (DUMCMP) 502 in advance.

The enough level-shift is not performed if the initial value data of the counter (CNT) 507 is set in such a manner that the low voltage Vstep is generated from the variable voltage power supply (VVS) 504. Accordingly, the dummy comparator (DUMCMP) 502 does not operate and the digital output Q is kept at "0". As a result, a clock signal obtained by dividing the clock signal SYSCLK synchronous with the comparison operation by the dividing circuit (PRS) 509 is inputted to the counter (CNT) 507. The output data of the counter (CNT) 507 changes such that the output voltage Vref of the D/A converter (DAC) 505 is increased by a voltage corresponding to one LSB of the D/A converter (DAC) 505. As a result, the pulse voltage Vstep is increased by the voltage corresponding to one LSB of the D/A converter (DAC) 505.

In this manner, the counter (CNT) 507 continues to count until the dummy comparator (DUMCMP) 502 operate normally and the digital output Q becomes "1". As a result, the pulse voltage Vstep rises gradually. When the pulse voltage Vstep reaches the appropriate voltage and the output Q of the dummy comparator (DUMCMP) 502 goes "1", the output Q of the flip-flop (FF) 508 is set to "1", so that the supply of the clock signal to the counter (CNT) 507 is gated and stopped and the count operation also stops. Through the above operation, the pulse voltage Vstep is adjusted to the appropriate voltage and supplied to all comparators (CMP). In a case where the re-adjustment is required, the pulse voltage applying section 4 can be reset by the calibration reset signal CALRST.

It is to ease the settling time which is required to DAC and the variable voltage power supply (VVS) 504 that the clock signal SYSCLK which synchronized with the comparison operation is divided.

Figure 5:
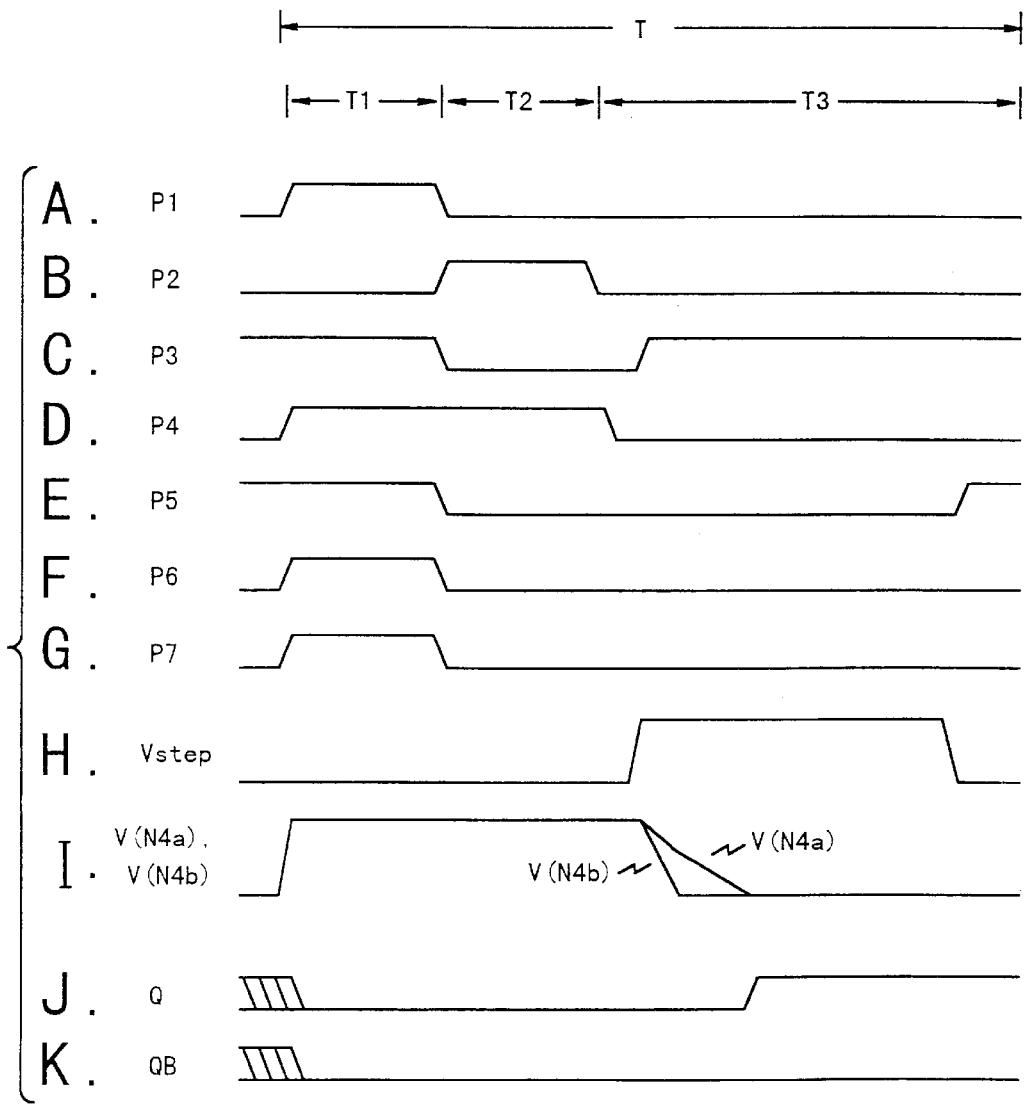
FIGS. 5A to 5K are timing charts for explaining the operation of comparator according to the third embodiment of the present invention.

Next, the operation of comparator according to the third embodiment of the present invention will be described with reference to FIGS. 5A to 5K. In FIG. 5A to 5B, P1 and P1B are signals generated by the controller 5 to turn on/off the first switches (a complementary switch composed of MOSFETs MN1*a* and MP1*a* and a complementary switch composed of MOSFETs MP1*b* and MP1b). P2 and P2B are signals generated by the controller 5 to turn on/off the second switches (a complementary switches composed of MOSFETs MN2*a* and MP2*a* and a complementary switch composed of MOSFETs MP2*b* and MP2*b*). P3, P4, P5 and P6 are signals generated by the controller 5 to turn on/off the third switches, (N-type MOSFET switches MN3*a* and MN3*b*), to turn on/off the fourth switches (N-type MOSFET switches MN4*a* and MN4*b*), to turn on/off the fifth switches, (N-type MOSFET switches MN5*a* and MN5*b*), to turn on/off the sixth switches (P-type MOSFET switches MP6*a* and MP6*b*). P7 is a signal generated by the controller 5 to turn on/off the MOSFET switches MN12*a*, MN12*b*, MP13*a*, and MP13*b*. P1B and P2B are inverted signals of P1 and P2.

A period T represents one cycle of the comparison operation and composed of periods T1, T2 and T3. In the period T1, the third switches MN3*a* and MN3*b* are turned on in response to the signals P1 and P1B to connect the nodes N2*a* and N2*b* to the ground as shown in FIG. 5C. Also, the fifth switches MN5*a* and MN5*b* are turned on in response to the signal P5 to connect the nodes N3*a* and N3*b* to the ground as shown in FIG. 5E. The fourth switches MN4*a* and MN4*b* are also turned on in response to the signal P4. However, because the signal P6 is in high level, the sixth switches are turned off. In this state, the first switches are turned on in response to the signals P1 and P1B so that the input voltage signals V1 and V2 are sampled.

In the period T2, the first switches are turned off in response to the signals P1 and P1B as shown in FIG. 5A. Instead, the second switches MN2*a*, MP2*a*, MN2*b* and MP2*b* are turned on in response to the signals P2 and P2B to connect the first and second reference voltage signals V1*r* and V2*r* to the capacitors C1*a* and C1*b*, respectively. Also, the fifth switches MN5*a* and MN5*b* are kept in the on state since the signal P4 is in the high level in the second period T2. Thereby, the first and second reference voltage signals V1*r* and V2*r* are sampled and the voltage difference ΔVa (=V1−V1*r*) and the voltage difference ΔVb (=V2−V2*r*) are generated as ΔVa1, ΔVb1 according to the above equations (1) and (2). At this time, because the third switches MN3*a* and MN3*b* are turned off in response to the signal P3, the reset operation is completed, as shown in FIG. 5C. The fifth switches are turned off in response to the signal P5 as shown in FIG. 5E and the nodes N3*a* and N3*b* are released from the ground. Further, since the signal P6 is in the low level, as shown in FIG. 5F, the sixth switches are turned on to connect the power supply voltage to the transistors T1*a* and T1*b*.

In the period T3, the voltages V(N3*a*) and V(N3*b*) of the nodes N3*a* and N3*b* are shifted into the optimal operation range of the transistors T1*a* and T1*b* by the pulse voltage Vstep from the pulse voltage applying section 4 in accordance with the above equations (3) and (4), as shown in FIG. 5H. When the voltages V(N3*a*) and V(N3*b*) of the nodes N3*a* and N3*b* reaches the operation point of the transistors T1*a* and T1*b*, the voltages are amplified to produce the voltages V(N4*a*) and V(N*b*) of the fourth nodes N4*a* and N4*b* as shown in FIG. 5I, since the sixth switches MP6*a* and MP6*b* has been turned on in response to the signal P6 as shown in FIG. 5F. In this case, FIGS. 5I, 5J and 5K show the waveforms of the signals V(N4*a*), V(N4*b*), Q and QB when the input signal satisfies V1>V2. If V1>V2, since V(N3*a*) <V(N3*b*) initially after the pulse voltage Vstep is applied in the period T3, the transistor T1*b* discharges more than the transistor T1*a*. As the result, the voltage V(N*b*) of the fourth node N4*b* is decreased faster than the voltage V(N4*a*) of the fourth node N4*a*. The difference between the voltage V(N4*a*) at the fourth node N4*a* and the voltage V(N*b*) of the fourth node N4b expands more by the feedback capacitors C3a and C3b. As a result, the input transistor MN10b of the differential latch (DLAT) is turned off faster than the input transistor MN10b of the differential latch, so that the outputs Q and QB of the differential latch (DLAT) are set to "1" and "0", respectively.

It should be noted that the timing charts of FIGS. 5A to 5K show only an example of operation of the comparator of the present invention. For instance, the signal P3 may be the same as the signal P5. Or, the timings of the signals may be shifted in phase a little one after another to eliminate the errors due to the switches. In addition, the timings of the signals P1 and P2 may be inverted such that the reference voltage signals V1r and V2r are first sampled and then the target voltage signals V1 and V2 are sampled. In this case, the outputs Q and QB have opposite values to the above-mention values, respectively.

The comparator according to the above embodiments can be used as the sense amplifier of the memory of the semiconductor integrated circuit. That is, signals of a differential bit line pair as the differential cell signals of the memory cells are inputted to the comparator of the present invention as the input voltage signals V1 and V2. Also, bit line precharge voltage is given as the reference voltages V1r and V2r. In this case, the comparator of the present invention can be used for a sense amplifier for amplifying the memory cell signal and detecting a digital data stored in the memory cell. In this case, if the reference voltage signals V1r and V2r are sampled in the period T1 and the target voltage signals V1 and V2 are sampled in the period T2, the operation speed of the comparator can be increased.

As described above, the present invention is described according to the above embodiments but the present invention is not limited to the embodiments and includes various modification based on the principle of the present invention, of course.

As described above, according to the comparator of the present invention, the differential voltage is shifted in level to the optimal operation points of the amplifiers using the coupling capacitors and pulse voltage. Therefore, the automatic-zero operation is not necessary in a differential amplifier and the comparator of the present invention can operate at a high speed in the low power supply voltage. Further, it is possible to use as the amplifier a dynamic operation type inverter which is difficult to perform the automatic-zero operation.

What is claimed is:

1. A comparator comprising:
   sampling means for obtaining first and second voltage signals from first and second target voltage signals respectively;
   amplifier means including first and second amplifiers, for amplifying shifted obtained first and second voltage signals by said first and second amplifiers, respectively;
   shifting means coupled between said sampling means and said amplifier means for shifting said obtained first and second voltage signals into predetermined operation ranges of said first and second amplifiers in respectively; and
   latching means for latching outputs of said first and second amplifiers to output data determined based on said first and second voltage signals.

2. A comparator according to claim 1, wherein said first and second amplifier are inversion amplifiers.

3. A comparator according to claim 2, wherein each of said first and second amplifiers comprises a dynamic operation type inverter.

4. A comparator according to claim 3, wherein each of said first and second amplifier comprises a transistor, and a switch connected to said transistor in series.

5. A comparator according to claim 1, wherein said amplifier means further comprises:
   a first capacitive component for feeding back the output of said second amplifier to an input of said first amplifier; and
   a second capacitive component for feeding back the output of said first amplifier to an input of said second amplifier.

6. A comparator according to claim 1, wherein said shifting means comprises:
   a first capacitor connected to an input of said first amplifier at one terminal;
   a second capacitor connected to an input of said second amplifier at one terminal;
   voltage applying means connected to the other terminals of said first and second capacitors, for applying a shift voltage to the other terminals of said first and second capacitors to change voltages at the one terminals of said first and second capacitors.

7. A comparator according to claim 6, wherein said shifting means further comprises means for setting the voltages at the one terminals of said first and second capacitors to predetermined voltages, respectively.

8. A comparator according to claim 6, wherein said voltage applying means applies voltage pulses to the other terminals of said first and second capacitors.

9. A comparator according to claim 6, wherein said voltage applying means applies to the other terminals of said first and second capacitors voltage pulses whose magnitude gradually increases in a step manner.

10. A comparator according to claim 9, wherein said voltage applying means comprises:
    counter means for counting a clock signal;
    variable power supply means for supplying variable voltage determined based on a count of said counter means; and
    step-like voltage pulse applying means for applying to the other terminals of said first and second capacitors said voltage pulses having the variable voltage in magnitude as said shift voltage such that voltages at the one terminals of said first and second capacitors are changed.

11. A comparator according to claim 1, wherein said sampling means comprises:
    first and second capacitors;
    first switch means for respectively applying said first and second target voltage signals to one terminals of said first and second capacitors; and
    second switch means for respectively applying first and second reference voltage signals to the one terminals of said first and second capacitors.

12. A comparator according to claim 11, wherein said sampling means further comprises means for selectively setting the other terminals of said first and second capacitors to first and second predetermined voltages.

13. A comparator according to claim 1, further comprising means for selectively disconnecting said sampling means from said amplifier means.

14. A comparator according to claim 1, further comprising means for selectively disconnecting said sampling means from said amplifier means and said shifting means.

15. A method of outputting binary data corresponding to two voltage signals, comprising the steps of:
    sampling first and second target voltage signals to produce first and second voltage signals in first and second periods, respectively;
    shifting said sampled first and second voltage signals into a predetermined operation range of amplifier means in a third period, respectively;

amplifying shifted first and second voltage signals by said amplifiers means in said third period; and latching outputs of said amplifier means to output a binary data determined based on said first and second voltage signals in said third period.

16. A method according to claim 15, wherein said sampling step include:

applying said first and second target voltage signals to one terminals of first and second capacitors in one of said first and second periods, respectively; and applying first and second reference voltage signals to the one terminals of said first and second capacitors in the other of said first and second periods, respectively, and wherein a voltage difference between said first target voltage signal and said first reference voltage signal is obtained as said first voltage signal and a voltage difference between said second target voltage signal and said second reference voltage signal is obtained as said second voltage signal.

17. A method according to claim 16, wherein said sampling step further includes setting the other terminals of said first and second capacitors to first and second predetermined voltages in said first period.

18. A method according to claim 15, further comprising the step of disconnecting said sampled first and second voltage signal from said amplifier means in said third period.

19. A method according to claim 15, wherein said shifting step includes:

applying, in said third period, a shift voltage to one terminals of third and fourth capacitors such that voltages at the other terminals of said third and fourth capacitors are shifted to produce said shifted first and second voltage signals.

20. A method according to claim 19, wherein said shift voltage is applied as voltage pulses to the one terminals of said third and fourth capacitors.

21. A method according to claim 20, wherein said shift voltage is applied as voltage pulses, whose magnitude gradually changes.

22. A method according to claim 15, wherein said shifting step further includes:

setting, in said first period, the other terminals of said third and fourth capacitors to third and fourth predetermined voltages.

23. A method according to claim 15, wherein said amplifying means includes first and second amplifiers for amplifying said shifted first and second voltage signals, respectively, and wherein said amplifying step includes feeding back output of said first and second amplifiers to inputs of said second and first amplifiers in a cross manner to expand a voltage difference between said shifted first and second voltage signals.

24. A comparator comprising:

first to fourth capacitors;

bias means coupled between one terminal of said first capacitor and one terminal of said third capacitor and between one terminal of said second capacitor and one terminal of said fourth capacitor, for selectively setting said first to fourth capacitors to a predetermined voltage;

voltage applying means connected to the other terminals of said third and fourth capacitors, for applying a shift voltage to the other terminals of said third and fourth capacitors to change voltages at the one terminals of said third and fourth capacitors;

amplifier means for amplifying the changed voltages at the one terminals of said third and fourth capacitors; and data latch means coupled to the amplifier means for outputting a data corresponding to voltage signals supplied to the other terminals of said first and second capacitors.

25. A comparator according to claim 24, wherein said amplifier means includes first and second inversion amplifiers for amplifying the changed voltages at the one terminals of said third and fourth capacitors, respectively.

26. A comparator according to claim 25, wherein said amplifier means further includes a fifth capacitor for feeding back an output of said first inversion amplifier to an input of said second inversion amplifier and a sixth capacitor for feeding back an output of said second inversion amplifier to an input of said first inversion amplifier.

27. A comparator according to claim 24, wherein said bias means includes:

first switches connected between the one terminal of said first and second capacitors and the ground potential, respectively;

second switches connected between the one terminal of said first capacitor and the one terminal of said third capacitor and between the one terminal of said second capacitor and the one terminal of said fourth capacitor; and third switches connected between the one terminal of said third and fourth capacitors and the ground potential, respectively.

28. A comparator according to claim 24, wherein said bias means includes:

first switches connected between the one terminal of said first and second capacitors and the ground potential, respectively; and second switches connected between the one terminal of said first capacitor and the one terminal of said third capacitor and between the one terminal of said second capacitor and the one terminal of said fourth capacitor.

29. A comparator according to claim 24, wherein said bias means includes:

first switches connected between the one terminal of said first capacitor and the one terminal of said third capacitor and between the one terminal of said second capacitor and the one terminal of said fourth capacitor; and second switches connected between the one terminal of said third and fourth capacitors and the ground potential, respectively.

30. A comparator according to claim 24, further comprising a sampling means for applying first and second target voltage signals and for applying first and second reference voltage signals, wherein said sampling means comprises:

first switches respectively connected to the other terminals of said first and second capacitors to apply said first and second target voltage signals via said first switches, respectively; and second switches respectively connected to the other terminals of said first and second capacitors to apply said first and second reference voltage signals via said second switches, respectively.

* * * * *